(12) United States Patent
Liebmann et al.

(10) Patent No.: US 6,901,576 B2
(45) Date of Patent: May 31, 2005

(54) PHASE-WIDTH BALANCED ALTERNATING PHASE SHIFT MASK DESIGN

(75) Inventors: Lars W. Liebmann, Poughquag, NY (US); Carlos A. Fonseca, Staten Island, NY (US); Ioana Graur, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 374 days.

(21) Appl. No.: 10/300,240

(22) Filed: Nov. 20, 2002

(65) Prior Publication Data

US 2004/0096752 A1 May 20, 2004

(51) Int. Cl.[7] .............................................. G06F 17/50
(52) U.S. Cl. ........................................ 716/19; 716/21
(58) Field of Search ........................ 716/19–21; 430/5, 430/22

(56) References Cited

U.S. PATENT DOCUMENTS

| | | | |
|---|---|---|---|
| 5,537,648 A | 7/1996 | Liebmann et al. | |
| 5,636,131 A | 6/1997 | Liebmann et al. | |
| 5,883,813 A | 3/1999 | Kim et al. | |
| 5,923,562 A | 7/1999 | Liebmann et al. | |
| 5,932,377 A | 8/1999 | Ferguson et al. | |
| 6,004,701 A | 12/1999 | Uno et al. | |
| 6,057,063 A | 5/2000 | Liebmann et al. | |
| 6,083,275 A * | 7/2000 | Heng et al. .................... | 716/19 |
| 6,183,916 B1 | 2/2001 | Kuo et al. | |
| 6,338,922 B1 | 1/2002 | Liebmann et al. | |
| 6,733,929 B2 * | 5/2004 | Pierrat ........................... | 716/19 |

FOREIGN PATENT DOCUMENTS

| | | |
|---|---|---|
| JP | 2000-235249 A | 8/2000 |
| WO | WO 01/20502 A1 | 3/2001 |

OTHER PUBLICATIONS

"Automated layout and phase assignment techniques for dark field alternating PSM" Kahng et al., UCLA Department of Computer Science, Los Angeles, CA.

U.S. Appl. No. 09/997,657, "Priority coloring for VLSI designs", filing date Nov. 29, 2001, Liebmann et al.

* cited by examiner

*Primary Examiner*—Matthew Smith
*Assistant Examiner*—Paul Dinh
(74) *Attorney, Agent, or Firm*—Todd M. C. Li (57) ABSTRACT

A method is provided for designing an altPSM mask including a substrate. The method includes the following steps. Provide a circuit layout. Identify critical elements of the circuit layout. Provide a cutoff layout dimension. Identify critical segments of the circuit layout which are critical elements with a sub-cutoff dimension less than the cutoff dimension. Create basic phase shapes associated with the critical segments. Remove layout violations from the phase shapes. Determine whether the widths of phase shapes associated with a critical segment have unequal narrower and wider widths. If YES, then widen each narrower phase shape to match the width of wider phase shape associated with the critical segment and repeat the steps starting with removal of layout violations until the test answer is NO. When the test answer is NO, provide a layout pattern to an output.

20 Claims, 8 Drawing Sheets

$$\delta = \frac{0.5 \lambda}{n - 1}$$

PHASE-WIDTH BALANCED ALTERNATING PHASE SHIFT MASK DESIGN

BACKGROUND OF THE INVENTION

1. Field of the Invention

This invention relates to photolithographic methods employed in the manufacture of Very Large Scale Integrated (VLSI) circuit design and more specifically relates to improved methods of generating phase shifted mask designs.

2. Description of Related Art

A Very Large Scale Integrated (VLSI) Complementary Metal Oxide Semiconductor (CMOS) chip is manufactured on a silicon wafer by a sequence of steps. The steps include adding material to the wafer by additive processes such as Low Pressure Chemical Vapor Depositions (LPCVD), sputtering operations, etc. Other steps include removal of material from the wafer subtractively by processes such as wet etches, reactive ion etches (RIE), etc. In addition the wafer can be further changed by material modifications such as steps of oxidation, ion implantation and the like. These physical and chemical operations interact with the entire wafer. For example, if a wafer is placed into an acid bath, the entire surface of the wafer will be etched away. In order to build very small electrically active devices on the wafer, the impact of these operations has to be confined to small, well defined regions.

Lithography in the context of VLSI manufacturing of CMOS devices is the process of patterning openings in photosensitive polymers referred to hereinafter as photoresist or resist. The openings in the photoresist provide access to small areas on the wafer in which the silicon base material or other structures formed thereon are modified by a specific operation in a sequence of processing steps. The manufacturing of CMOS chips involves the repeated patterning of photoresist, followed by an etching, implant, deposition, or other operation, and ending with the removal of the remaining photoresist to make way for a new resist layer to be applied and patterned photolithographically for another iteration of this process sequence.

The basic lithography system consists of a light source, a stencil or photomask (photolithograpic mask) containing the pattern to be transferred to the wafer, a collection of lenses, and a means for aligning existing patterns on the wafer with patterns on the mask. The aligning may take place in an aligning step or steps and may be carried out with an aligning apparatus. Since a wafer containing from 50 to 100 chips or more can be patterned in steps of 1 to 4 chips at a time, these lithography tools are commonly referred to as steppers. The resolution, R, of an optical projection system such as a stepper is limited by parameters described in Raleigh's equation:

$$R = k\lambda/NA$$

where $\lambda$=wavelength of the light source of the projection system

NA=numerical aperture of the projection optics used.

"k" =factor describing how well a combined lithography system can utilize the theoretical resolution limit in practice, ranging from a high of about 0.8 down to a low of about 0.5 for standard exposure systems.

The highest resolution in optical lithography is currently achieved with Deep Ultra Violet (DUV) steppers operating at 248 nm. Wavelengths of 356 nm are also in widespread use and 193 nm wavelength lithography is becoming commonplace.

Conventional photo-masks consist of chromium patterns formed on the exterior surface of a quartz plate. The chromium is removed from the surface of the quartz plate in a desired pattern thereby forming a photo-mask. When one allows light to pass therethrough light of a specific wavelength to be projected through the photo-mask onto a photoresist (resist) coated wafer, the resist is exposed wherever hole patterns are located on the photo-mask. Exposing the resist to light of the appropriate wavelength causes modifications in the molecular structure of the resist polymers which, in common applications, allow a developer to dissolve and remove the resist in the exposed areas. Such resist materials are known as positive resists. (Negative resist systems allow only unexposed resist to be developed away.) At the dimensions of leading edge IC (Integrated Circuit) lithography, a photo-mask can be pictured as an array of individual, infinitely small light sources which can be either turned on (points in clear areas) or turned off (points covered by chrome). If the amplitude of the electric field vector which describes the light radiated by these individual light sources is mapped across a cross section of the mask, a step function will be plotted reflecting the two possible states that each point on the mask can be found (light on, light off).

Such conventional photo-masks are known as Chrome on Glass (COG) binary masks because of their substantially binary image amplitude. The perfectly square step function of the light amplitude exists only in the theoretical limit of the exact mask plane. At any given distance away from the mask, such as in the wafer plane, diffraction effects cause images to exhibit a finite image slope. At small dimensions, that is, when the size and spacing of the images to be printed are small relative to the $\lambda/NA$ (wavelength/Numerical Aperture), electric field vectors of adjacent images interact and add constructively. The resulting light intensity curve between the image features is not completely dark, but exhibits significant amounts of light intensity created by the interaction of adjacent features. The resolution of an exposure system is limited by the contrast of the projected image, that is, the intensity difference between adjacent light and dark image features. An increase in the light intensity in nominally dark regions eventually causes adjacent features to print as a single combined structure rather than discrete images.

The quality with which small images can be replicated lithographically depends largely on the available process latitude; that is, that amount of allowable dose and focus variation that still results in correct image size. The technique known as Phase Shifted Mask (PSM) lithography improves the lithographic process latitude or allows operation at a lower k value by introducing a third parameter on the mask. The electric field vector, like any vector quantity, has a magnitude and direction, so, in addition to turning the electric field amplitude ON and OFF, it can be turned ON with a phase of about 0° or turned ON with a phase of about 180°. This phase variation is achieved in PSMs by modifying the distance that a light beam travels through the mask material. By recessing a section of the mask to an appropriate depth, light traversing the thinner portion of the mask and light traversing the thicker portion of the masks will be 180° out of phase, that is, their electric field vector will be of equal magnitude but the two vectors will point in exactly the opposite directions so that any interaction between these light beams results in perfect cancellation.

Alternating Phase Shifted Mask (altPSM) enhanced lithography with photolithographic masks (photo-masks) is a resolution enhancement technique that is rapidly gaining acceptance as a viable solution to meet aggressive Integrated Circuit (IC) technology scaling time-lines.

Successful implementation of the altPSM process is currently of vital importance because the prospect of alternative solutions to manufacturing problems outlined above are not likely to exist in the near term in view of the prospective delays in the next generation of optical and non-optical lithography tooling. The AltPSM enhanced lithography process takes advantage of the destructive interference of light to double the achievable resolution of an optical lithography system. The light interference is created by selectively manipulating the topography of the photo-mask to introduce an appropriate path-length difference in the imaging light. Since recessed regions on the photo-mask can be fabricated only in closed polygons rather than individual edges, destructive interference of light across phase region edges which do not line up with desired circuit patterns, causes undesired shadows in the projected image. These undesired images need to be avoided through a more complex mask design or erased in a second exposure. The required manipulation of the mask topography for the phase mask and the additional requirement of a trim solution force information to be added to the circuit layout in the CAD (Computer Assisted Design) system which employs the altPSM process We believe that the trend is for altPSM to be implemented as Dark Field (DF) altPSM plus Bright Field (BF) trim which requires the design of the inverse of 0° phase regions and 180° phase regions on opposite sides of the critical features.

A key factor in the successful implementation of the altPSM process is an efficient Electronic Design Automation (EDA) tool capable of converting circuit designs to altPSM layouts with minimal impact to layout design density or design complexity. The process of defining a set of inverse phase regions of the mask as 0° phase regions and the 180° phase regions is generally referred to as phase coloring. In the phase coloring process a plurality of "intrusion pairs" of inverse phase regions are formed juxtaposed with opposite sides of the critical feature of the chip layout including a 0° phase region on one side of the critical feature and a 180° phase region on the opposite side of the critical feature. The intrusion pairs of inverse phase regions are formed with one phase region on either side of the critical feature so that a grating pattern is formed on the mask layout.

Techniques for automatic phase coloring are known. For example, commonly assigned Kim et al., U.S. Pat. No. 5,883,813 for "Automatic Generation of Phase Shift Masks Using Net Coloring" describes a method for automatically assigning binary phase coloring in altPSM designs by the use of net coloring where a PSM net is a set of shapes that are phase coupled together and are treated as a single entity, with the phase coupling as the connected function that allows the shapes to be stored as a PSM net. PSM nets that are elements of higher level PSM nets are referred to as 'nested PSM nets. In Kim et al. it is stated that "the generation of phase shift masks, the phase coloring of one shape can affect the phase coloring of a "nearby" shape. Such shapes are 'coupled' with respect to phase coloring. Each pair of nearby shapes are referred to as an 'intrusion pair,' meaning the phase of one determines the phase of the other. The CAD data structure input preferably contains a list of all intrusion pairs or otherwise contains the data from which the intrusion pair list can be derived." In other words, the phase of one shape can determine the coloring and thus the phase of the inverse shape within each intrusion pair. The intrusion pairs are shapes that are in sufficiently close proximity that light passing through the shapes interacts to affect the image intensity between the shapes. Thus, intrusion pairs that are sufficiently close together will likewise interact and will be coupled together by a "connected" function that defines a net. All phase shapes within a net will be colored together such that phases alternate across each critical element. The Kim et al. technique can be applied to both dark-field and light-field PSM designs, and can be adapted to both flat and hierarchical VLSI CAD databases.

Commonly assigned U.S. Pat. No. 6,338,922 of Liebmann et al for "Optimized Alternating Phase Shifted Mask Design" describes a method of improving variation in line width in altPSM photolithographic patterning of a chip layout having several features. A determination is made as to which are the critical features of the layout. The phase coloring process is employed in which the plurality of intrusion pairs of inverse phase regions in which 0° phase regions alternate with 180° phase regions are juxtaposed with opposite sides of the critical feature of the chip layout. The intrusion pairs of inverse phase regions are formed with one phase region on either side of the critical feature so that a grating pattern is formed on the mask layout. Then a dark field trim mask which comprises a complementary mask pattern is formed to selectively erase undesired printed images of the grating patterns. Preferably, the complementary mask pattern comprises a bright field block mask when the mask layout is a dark field alternating phase shifted mask. Alternatively, the complementary mask pattern comprises a dark field trim mask when the mask layout is a bright field alternating phase shifted mask. Features of the chip layout are reconstructed to form a desired mask layout.

Methods to assign and optimize phases in an altPSM design are known in the art, for example, as described in commonly assigned U.S. Pat. No. 5,537,648 of Liebmann et al. for "Geometric Autogeneration of 'Hard' Phase-Shift Designs for VLSI" (also a division thereof U.S. Pat. No. 5,636,131 and commonly assigned U.S. Pat. No. 6,057,063 of Liebmann et al. for "Phase Shifted Mask Design System, Phase Shifted Mask and VLSI Circuit Devices Manufactured Therewith".

A problem arises when the dimensions of the critical feature of a device falls below a narrow dimension which may lead to problems such as delamination of narrow strips on a mask used to expose the resist patterns using the altPSM method leading to failure of the process.

The generation of an altPSM layout requires the addition of the inverse phase shapes on opposite sides of layout features that have dimensions smaller than the Cut-Off Dimension related to the resolution of the lithography system, referred to hereinafter as a sub-cutoff layout dimension, and a layout dimension that is less than the Cut-Off Dimension (COD) is referred to hereinafter as a sub-Cut-Off dimension.

The design of an altPSM layout involves disposing the inverse phase shifting shapes on opposing sides of the sub-Cut-Off Dimension feature with one of the two inverse phase shapes beings assigned a phase shift that is 180° degrees out of phase from that of the phase shape on the opposite side of the sub-Cut-Off dimension feature. Thus, layout decisions must be made regarding the size, spacing/ and phase assignment of the inverse phase shapes relative to the layout of circuit elements. This manipulation of the mask topography requires phase information to be added to the circuit layout in the computer-aided design (CAD) system. The key to the successful implementation of altPSM is an efficient electronic design automation (EDA) tool that can convert circuit designs to altPSM layouts with minimal impact on the layout design density or design complexity.

Figures 1, 2A, 2B:
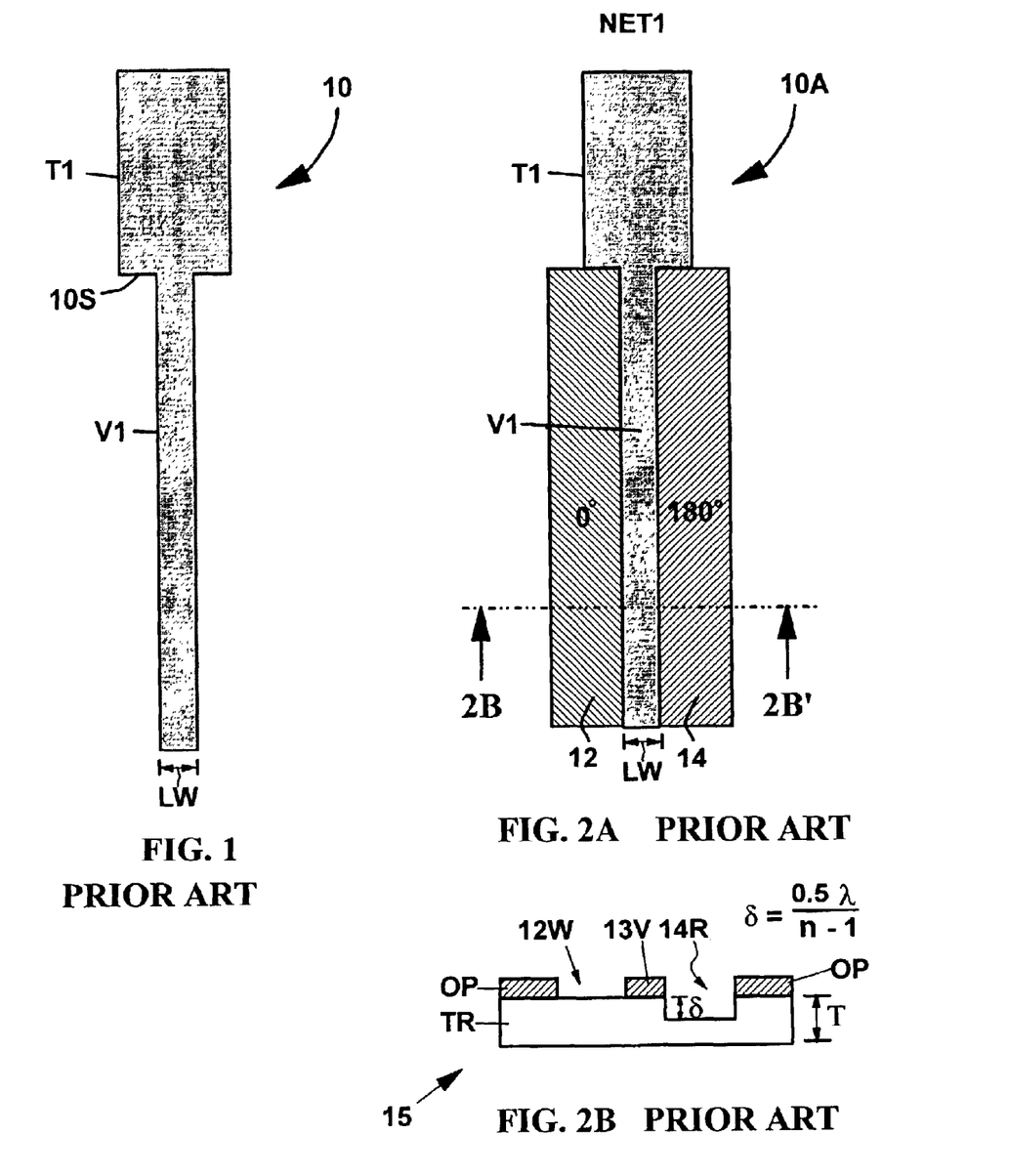
FIG. 1 shows a plan view of a layout of a simple prior art polysilicon conductor structure transistor to be printed, which cannot be printed with sufficient accuracy when employing the prior art process illustrated by FIG. 3.
FIGS. 2A and 2B illustrate a prior art approach to patterning and printing the layout shown in FIG. 1 with the prior art process steps shown in FIG. 3.

A problem in the prior art is that as dimensions shrink, some portions of features that need to be printed by the altPSM process are distorted by the patterning process. FIG. 1 shows a plan view of a layout 10 of a simple prior art polysilicon conductor structure transistor to be printed, which cannot be printed with sufficient accuracy when employing the prior art process illustrated by FIG. 3.

The transistor layout 10 has a wide rectangular head T1 on top with shoulders 10S on the bottom and a narrower vertical leg V1. The vertical leg V1 comprises a relatively thin line with a Line Width LW with a sub-Cut-Off dimension; but the head T1 is wider than the Cut-Off dimension. As stated above, the layout 10 of FIG. 1 includes a line V1 extending below the top T1 and the shoulders 10S.

Figure 3:
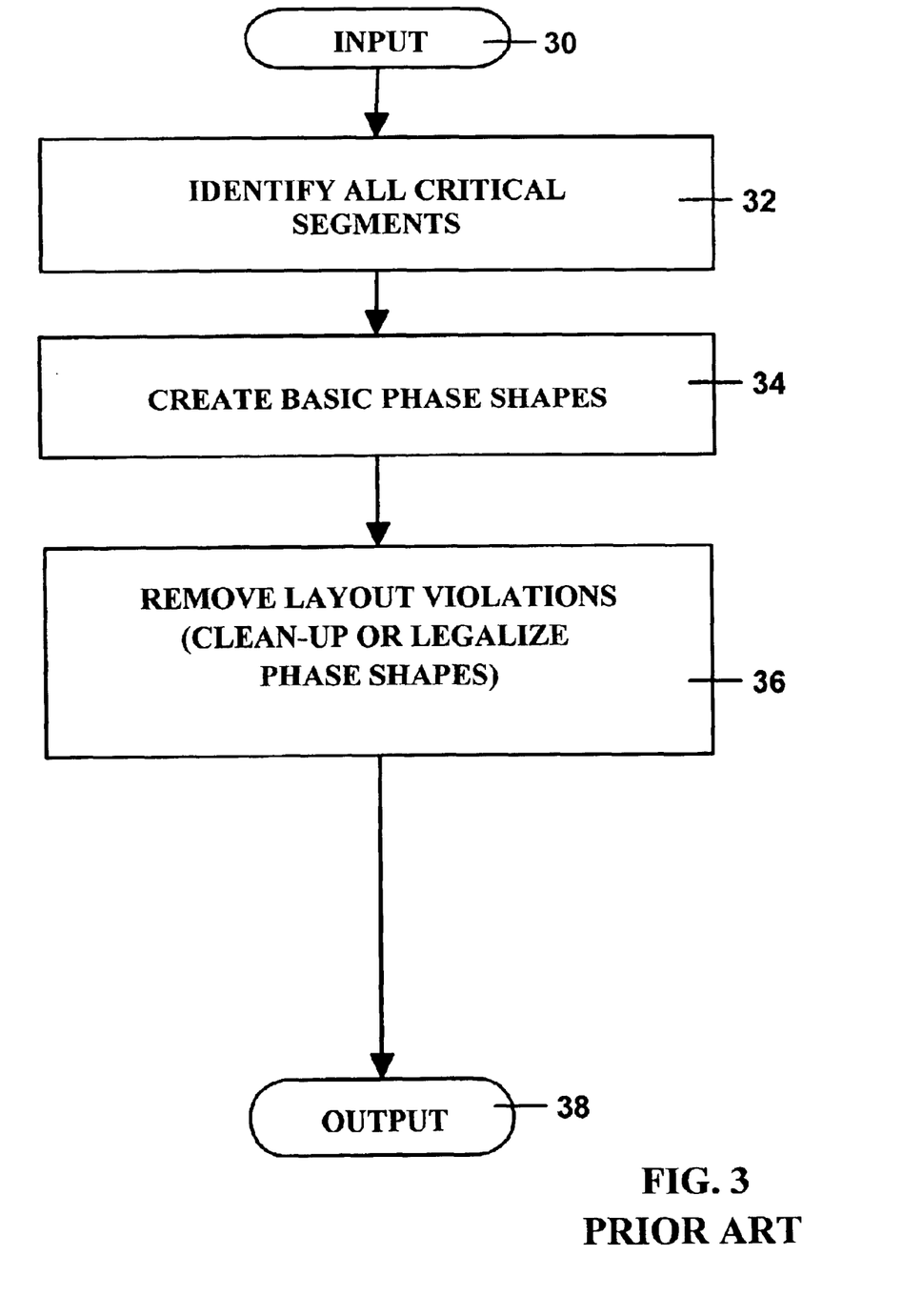
FIG. 3 is a flow chart illustrating the process steps of a prior art altPSM net coloring method ion which the generation of an altPSM layout requires the addition of the inverse phase shapes on opposite sides of layout features that have sub-Cut-Off layout dimension dimensions that are smaller than the Cut-Off Dimension of resolution of the lithography system.

FIGS. 2A and 2B illustrate a prior art approach to patterning and printing the layout 10 shown in FIG. 1 with a prior art altPSM net coloring process steps shown in FIG. 3. FIG. 2A is an example of a phase shifted layout, showing a transparent 0° phase shift pattern 12 and half wave length 180° phase shift pattern 14 juxtaposed with the line V1 on opposite sides thereof. FIG. 2B is a cross section of a hypothetical photo-mask 15 to be employed to form the 0° and the 180° phase regions 12/14.

The key to this specific example is the fact that two phase shift pattern 12/14 need to be defined for each critical segment of a layout structure. As shown in FIG. 2A, both the 0° and the 180° phase regions 12/14 have to be defined in the layout, even though no special processing is required on the mask for 0° regions.

FIG. 2A illustrates a schematic of a typical transistor altPSM layout NET1 which includes the transistor feature 10 showing the vertical line V1 with the sub-CutOff layout dimension (LW) included in an altPSM layout with an inverse pair of phase shift masks 12 and 14 (serving as net coloring shapes) on opposite sides thereof including a left zero degree (0°) phase shift region 12 and as right one hundred eighty degree (180°) phase shift region 120. In addition to being assigned inverse phases on opposite sides of a critical feature, the phase shapes or regions need to obey a variety of lithographic, mask manufacturability, and design rules governing their size and spacings.

Some rules are mutually opposing and require careful optimization as discussed in detail in commonly assigned, copending, U.S. patent application Ser. No. 09/997,659 (FIS9-2001-0237) of Liebmann et al. for "Priority Coloring for VLSI Designs" which is incorporated herein by reference. In the past, a designer would generate on the monitor of a Computer Assisted Design (CAD) system when employing the prior art method illustrated by FIG. 3 with an EDA tool to generate the line V1 aligned with the inverse pair of phase shift masks 12 and 14.

FIG. 2B shows a specific embodiment of a mask employed to implement the altPSM concept in a dark field altPSM mask 15 for correct positive design levels (drawn CAD shapes equate to resist features). The dark field mask 15 of FIG. 2B comprises a transparent quartz substrate TR (with a thickness Tau "T") covered on its top surface with an opaque, thin film OP composed of a metal such as chrome except for zero (0°) degree phase region 12W and one hundred eighty (180°) degree phase region 14R which is a depression with a depth "δ" plus bright field trim (employing a block mask shown in FIG. 4D to protect patterns formed by the altPSM and to form non-critical patterns). The one hundred eighty (180°) phase coloring process is employed in which the plurality of intrusion pairs of inverse phase regions in which 0° phase regions alternate with 180° phase regions are juxtaposed with opposite sides of the critical feature of the chip layout. The depth "δ" of depression 14R is defined by the equation as follows:

$$\delta = 0.5\ \lambda/n - 1$$

Figures 4A, 4B, 4D:
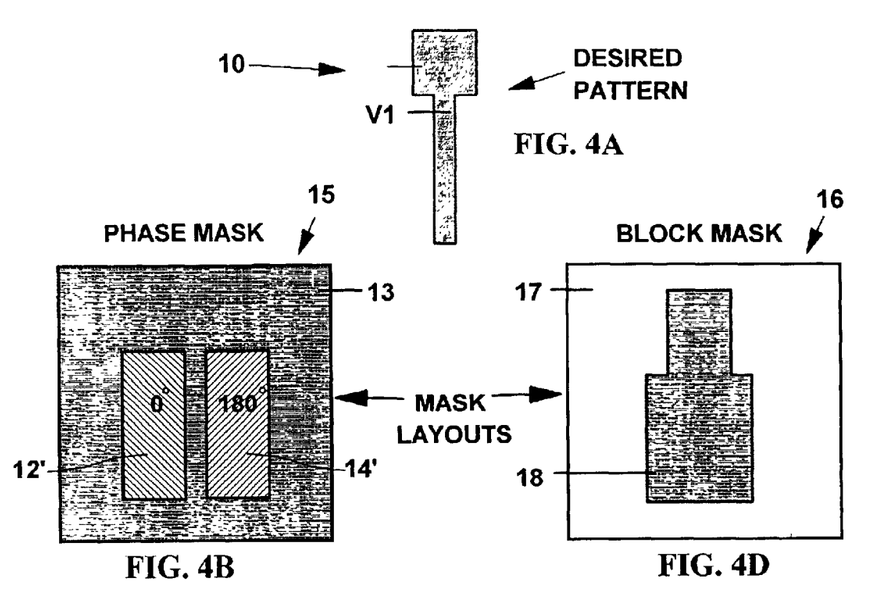
FIGS. 4A–4F illustrate the use of the process of FIG. 3 to form the polysilicon transistor layout 10 of FIG. 2A. The resulting distorted pattern produced by the process of FIG. 3 is shown by FIG. 4F

A plan view of a dark field mask 15 for forming the layout of FIG. 2A is shown in FIG. 4B. with 0° phase region 12' and 180° degree phase region 14' formed in the surrounding dark field structure 13.

Referring to FIG. 3, which shows the process steps of a prior art altPSM net coloring method, the generation of an altPSM layout requires the addition of the inverse phase shapes on opposite sides of layout features that have dimensions smaller than the Cut-Off Dimension related to the resolution of the lithography system, referred to hereinafter as a sub-Cut-Off layout dimension. The prior art program of FIG. 3 begins with an input 30 which leads to the identification step 32 in which all critical segments of the layout being designed.

Then the program progresses to step 34 of creating basic phase shapes, i.e. inverse pairs of phase shifting shapes on either side of the critical segments (i.e. critical features) such as the 0° phase shifting shape 12 and 180° degree phase shifting shape 14 adjacent to the vertical line V1 in FIG. 2A.

The program then proceeds to step 36 in which layout violations are removed in accordance with the state of the art. In other words the layout of FIG. 2A is cleaned up or phase shapes are legalized as will be understood by those skilled in the art by reference to the above referenced patents.

Finally, the program provides the output 38 for an appropriate layout.

In current altPSM design methods, the creation of an inverse pair of phase shifting shapes (Block 34 of FIG. 3) is based on a Cut-Off Dimension (COD) related to the CD of the critical element. If the CD is larger than the COD, no phase shifting is required, and the phase shapes are not drawn by the layout tool. If the critical dimension is less than the cutoff dimension, phase shapes having a predetermined, fixed width are drawn by the layout tool as illustrated by FIG. 2A.

Figures 4C, 4E, 4F:
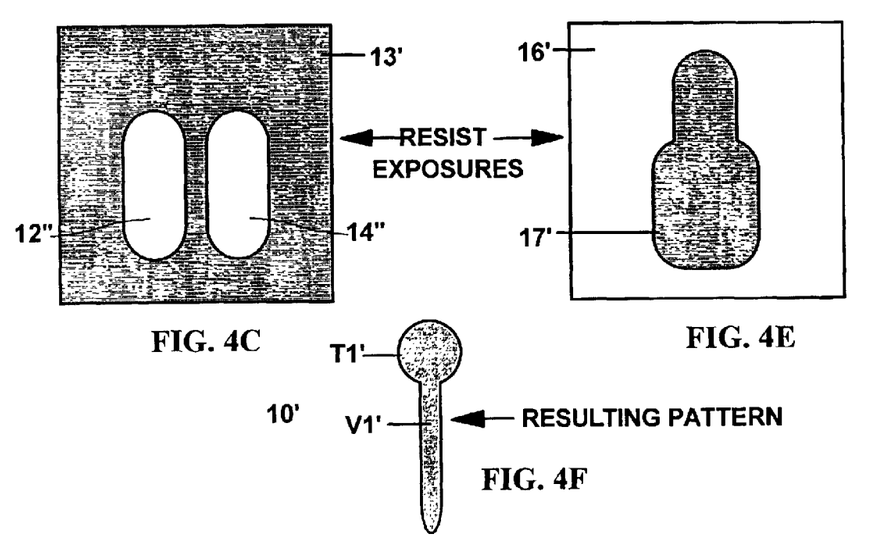

FIGS. 4A–4F illustrate the use of the process of FIG. 3 to form the polysilicon transistor layout 10 of FIG. 2A. The resulting distorted pattern produced by the process of FIG. 3 is shown by FIG. 4F FIG. 4A shows the desired pattern 10 of the polysilicon transistor layout 10.

FIG. 4B shows the dark field altPSM phase mask 15 with opaque background 13 and 0° degree phase shifting window 12' and 180° degree phase shifting window 14' therethrough.

FIG. 4C shows the pattern 13' projected onto resist with exposed patterns 12" and 14" corresponding to the windows 12' and 14'.

FIG. 4D show the bright field trim (block) mask 15 which is transparent except for an opaque pattern 16 which used to provide a double exposure exposing areas outside of the location of the desired pattern.

FIG. 4E shows an image 16'of the pattern of exposed by the block mask 16 on the photoresist.

FIG. 4F shows the resulting pattern 10'of the double exposure process. Layouts (outside) and corresponding aerial images (inside) are shown along with the combined image (bottom) that closely resembles the target pattern.

Problem Description

Figure 5:
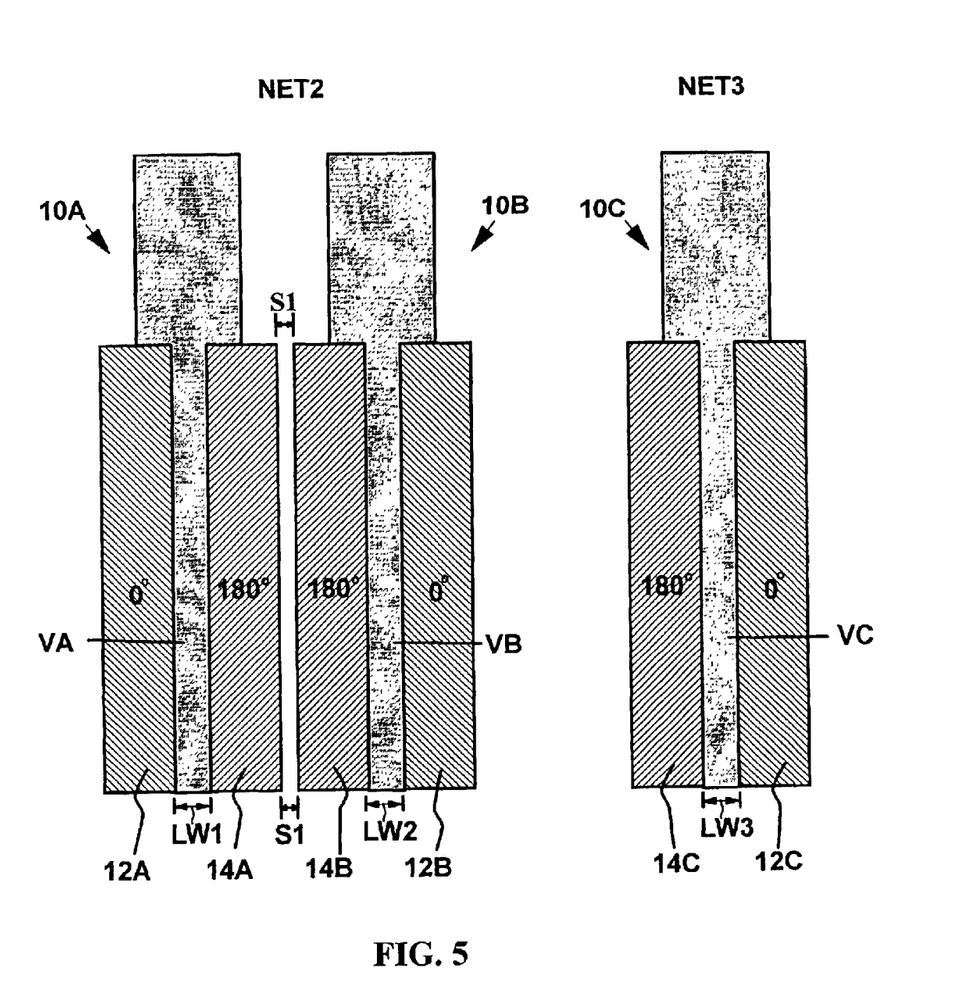
FIG. 5 illustrates an example of a nested layout in which there are two PSM nets to be patterned by the altPSM process.

FIG. 5 illustrates an example of a nested layout in which there are two PSM nets NET2 and NET 3 to be patterned by the altPSM process. The second (PSM) NET2 includes two transistors 10A and 10B which vertical legs VA and VB with line widths LW1 and LW2 which are substantially equal to the width of line V1 in FIGS. 1 and 2A. The third net NET3 includes transistor 10C which is spaced widely from the second net NET2. However, with the phase regions 12A/14A on opposite sides of the leg VA and the phase regions 14B/12B on opposite sides of the leg VB, a very narrow space S1 remains. This narrow space S1 between the adjacent 180° phase shift masks 14A and 14B is narrower than a minimum value below which only a narrow sliver of chromium would remain on the type of mask seen in FIG. 2B. Such a narrow sliver of chromium would be likely to peel off of the quartz substrate. Thus when some phase regions violate the minimum phase-to-phase spacing between phase shift masks in a nested layout such as the pair of transistors 10A and 10B as shown in FIG. 5 an adjustment of the phase shift mask structures must be made. In the example shown, the space S1 between the two nested phase regions is smaller than the mask and lithography processes will allow.

Figure 6:
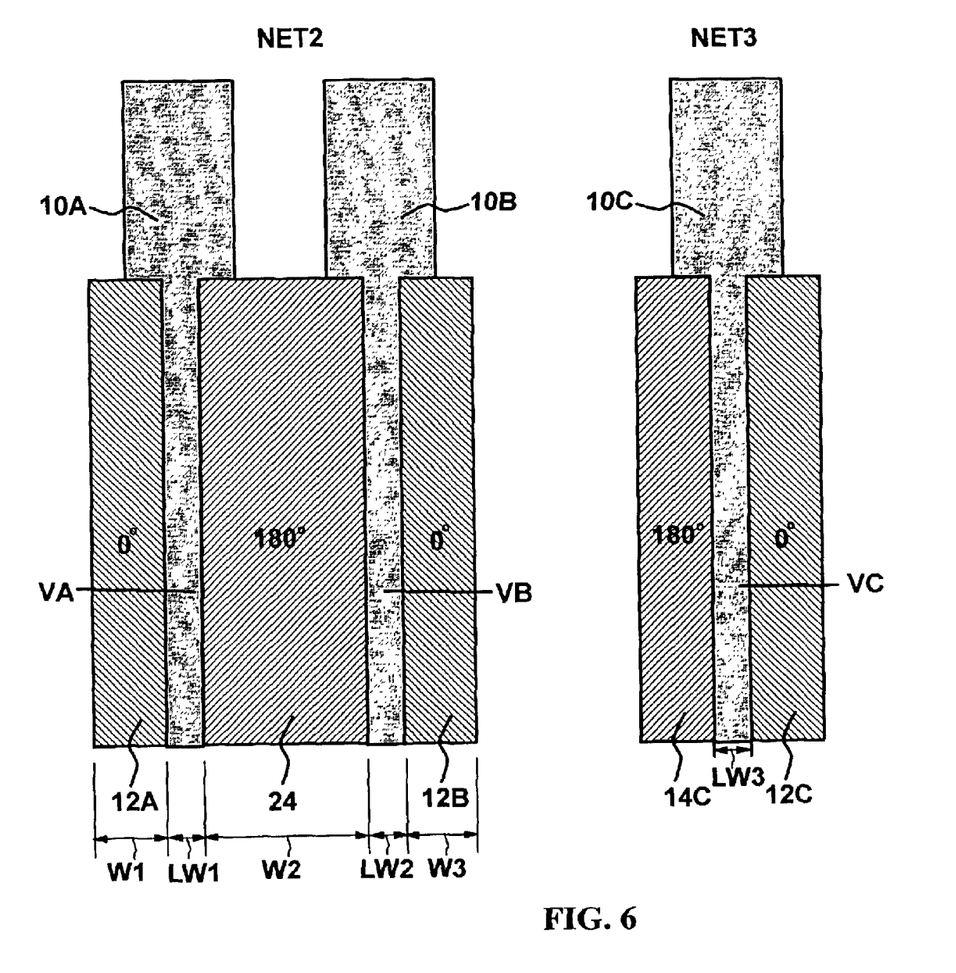
FIG. 6 illustrates a possible solution to the spacing violation by adjusting the width of phase regions between nested structures by merging adjacent regions to form one wider, common phase region when the feature spacing is insufficient to contain two separate phase regions.

FIG. 6 illustrates a possible solution to the spacing violation by adjusting the width of phase regions between nested structures by merging adjacent regions to form one wider, common phase region when the feature spacing is insufficient to contain two separate phase regions. In FIG. 6, the result of merging the closely spaced phase regions 14A/14B into a single far wider 180° phase shift region 24. The result is that the wider 180° phase shift region 24 fills the space between the two nested lines VA/VB.

However, the result in FIG. 6 is the clearly visible fact that there is a gross difference in widths between the narrow outer phase widths of regions 12A/12B on the two sides of the nested features VA/VB as compared with the very wide region 24. This phase-width imbalance on opposite sides of the nested features VA/VB can cause process window degradation and can introduce pattern placement errors because of an imbalance of light wave intensity profiles from left to right in FIG. 6.

While the merging of phase regions can be limited it cannot be avoided completely by employing the techniques of which create phase transitions spanning across narrow spaces between 180° phase regions. Thus, in view of the foregoing discussion, there is a need to provide for a method for designing an alternating phase shifted mask (altPSM) that minimizes unbalanced phase widths with an unacceptable degree of phase width difference caused by a feature that has a nested neighbor only on one side leads to process window degradation and image placement errors.

SUMMARY OF THE INVENTION

In accordance with this invention, a method is provided for designing an alternating phase shifting mask (altPSM), the mask including a substrate. The method includes the following steps.
a) Provide a circuit layout.
b) Identify a plurality of critical elements of the circuit layout.
c) Provide a cutoff layout dimension.
d) Identify critical segments of the circuit layout wherein each of the plurality of critical elements has a sub-cutoff dimension less than the cutoff dimension.
e) Create basic phase shapes associated with the critical segments.
f) Remove layout violations from the phase shapes.
g) Test to determine whether the widths of phase shapes associated with a critical segment have unequal narrower and wider widths. If the test result is YES, then widen each narrower phase shape to match the width of wider phase shape associated with the critical segment. Repeat the steps (f) through (g) until the test answer is NO.
h) If the test answer is NO, then provide a layout pattern to an output.

Preferably, the method includes generating a first phase shape and a second phase shape disposed on opposing sides of each of the sub-cutoff dimensions; and coloring phase shapes for each of the sub-cutoff dimensions so that the first phase shape and the second phase shape are assigned opposite phase colors. Preferably, the opposite phase colors are 180° out of phase; preferably consisting of 0° and 180° phase shifts.

Preferably, the method includes the following steps.
i) Determine whether one phase shape is expandable.
j) Locate phase regions that are wider than nominal.
k) Locate critical edges that abut a wide phase region.
l) Measure the widths of the wide phase region and an adjoining critical feature.
m) Create a phase shape of equal width on the opposite side of a critical segment.

Preferably, the method includes generating a first phase shape and a second phase shape disposed on opposing sides of each of the sub-cutoff dimensions; and coloring phase shapes for each of the sub-cutoff dimensions so that the first phase shape and the second phase shape are assigned opposite phase colors.

In accordance with another aspect of this invention, a computer program product comprising a computer readable storage medium having stored therein instructions executable by the computer for performing a method for assigning a binary property to circuit elements includes the following steps.
a) Provide a circuit layout.
b) Identify a plurality of critical elements of the circuit layout.
c) Provide a cutoff layout dimension.
d) Identify critical segments of the circuit layout wherein each of the plurality of critical elements has a sub-cutoff dimension less than the cutoff dimension;
e) Create an inverse pair of basic phase shapes associated with the critical segments juxtaposed therewith on opposite sides thereof.
f) Remove layout violations from the phase shapes.
g) Perform a test to determine whether the widths of phase shapes associated with a critical segment have unequal narrower and wider widths If the test result is YES, then widen each narrower phase shape to match the width of wider phase shape associated with the critical segment and repeat steps (f) through (g).
h) If the test result is NO, then provide a layout pattern to an output.

Preferably the computer program product involves the following steps:
i) Determine whether one phase shape is expandable.
j) Locate phase regions that are wider than nominal.
k) Locate critical edges that abut a wide phase region.
l) Measure the widths of the wide phase region and an adjoining critical feature.
m) Create a phase shape of equal width on the opposite side of a critical segment.

Preferably the computer program product includes generating a first phase shape and a second phase shape disposed on opposing sides of each of the sub-cutoff dimensions; and coloring phase shapes for each of the sub-cutoff dimensions so that the first phase shape and the second phase shape are assigned opposite phase colors.

Preferably, the opposite phase colors are 180° out of phase and preferably the the opposite phase colors consist of 0° and 180° phase shifts.

The present invention addresses the above-described need by providing a method for optimizing the design of an alternating phase shifted mask (altPSM) by selecting phase shapes that suitable have phase widths and configurations resulting in satisfactory patterning.

The proposed invention avoids the negative effect of unbalanced phase widths by locally growing narrow phase regions as necessary.

BRIEF DESCRIPTION OF THE DRAWINGS

The foregoing and other aspects and advantages of this invention are explained and described below with reference to the accompanying drawings, in which.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DESCRIPTION OF THE PREFERRED EMBODIMENTS

In the following descriptions of the preferred embodiments of the invention, a method is provided for optimizing the design of an altPSM layout.

Figure 7:
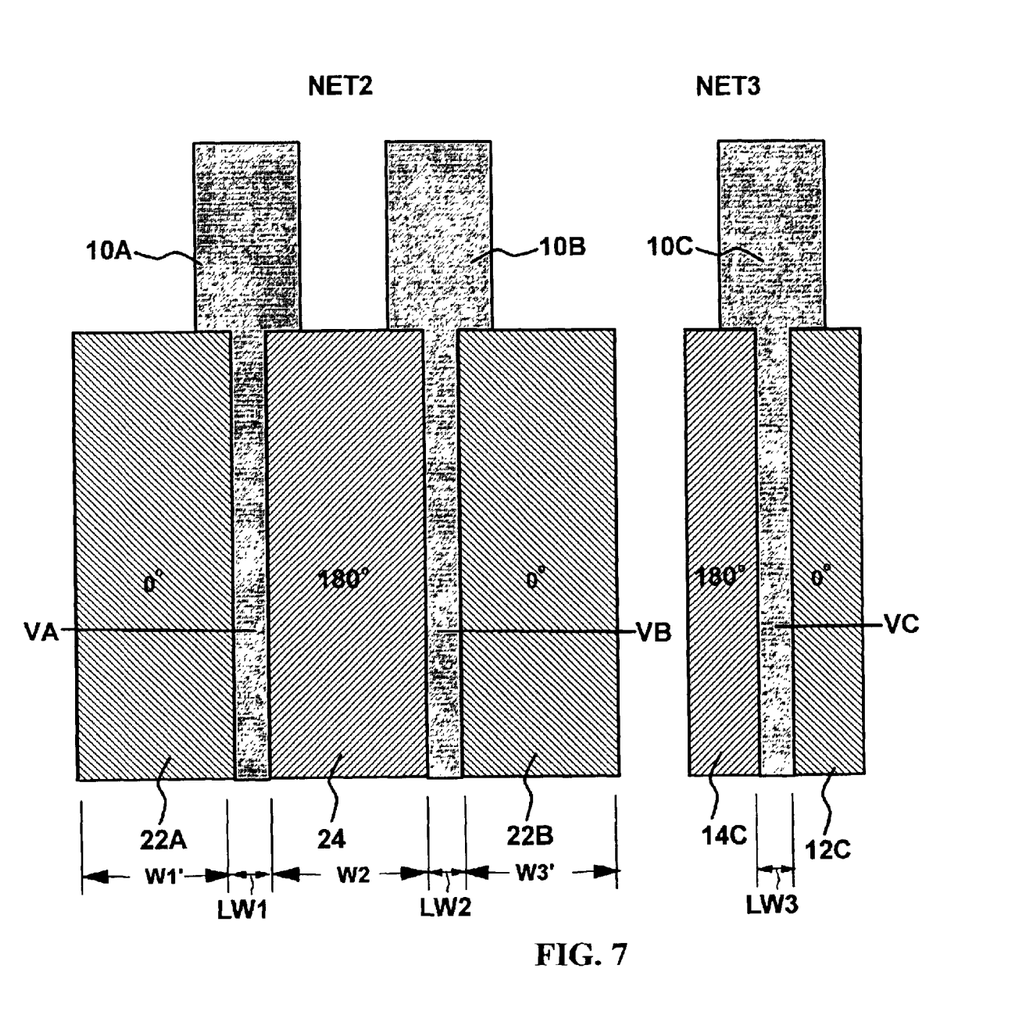
FIG. 7 shows an example of a solution in accordance with the present invention by selectively widening the narrower outer phase regions to locally re-balance the phase width.

FIG. 7. shows an example of a solution in accordance with the present invention to solving the problems of unbalanced phase widths with an unacceptable degree of phase width difference caused by a feature that has a nested neighbor only on one side leads to process window degradation and image placement errors in FIG. 6 by selectively widening the narrower outer phase regions to locally re-balance the phase width FIG. 7 shows an approach in which an algorithm in accordance with this invention has provided matching 0° phase regions 22A/22B on the outside of the transistor layouts on both sides of the transistors 10A/10B with the 180° phase region 24 of FIG. 6 in the middle between both sides of the transistors 10A/10B. In this design the outer 0° phase regions 22A/22B have equal widths to the 180° phase region 24, thereby overcoming the problem when an altPSM mask has substantial unbalanced phase widths with an unacceptable degree of phase width difference caused by a feature that has a nested neighbor only on one side leads to process window degradation and image placement errors.

After a first pass phase shape design, regions of widened phase are identified. In FIG. 7, the narrow phase regions on the opposite 0° phase regions 12A/12B sides of the phase shifted structures which need to be widened are identified and in accordance with this invention, the widths are expanded proportionally to the phase width differences between phase regions which are determined to have sufficient interaction to require adjustment.

Figure 8:
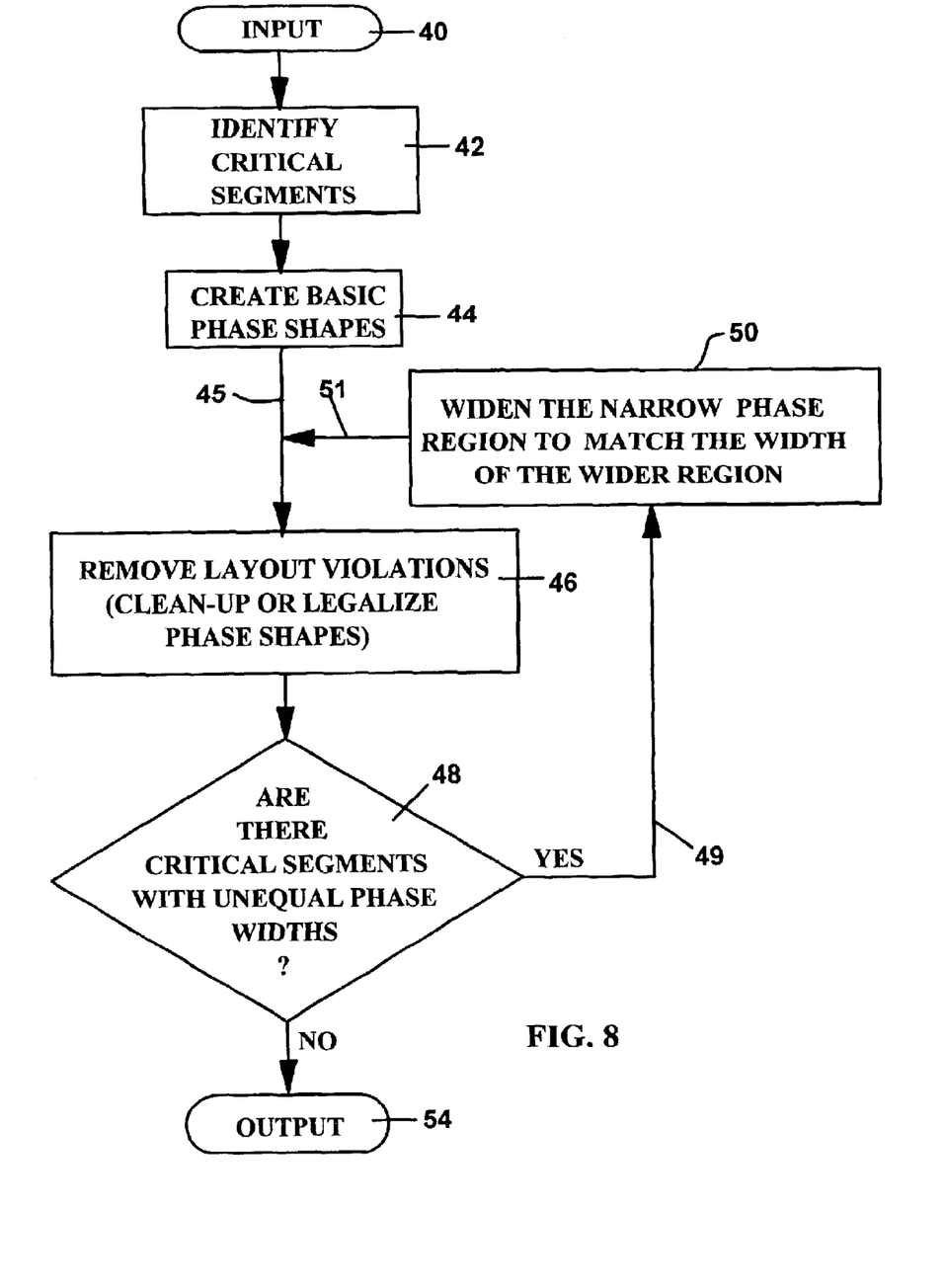
FIG. 8 is a flow chart showin an embodiment of the method of this invention for selectively adjusting widths of phase regions to locally re-balance phase widths.

FIG. 8 is a flow chart illustrating a first embodiment of the method of this invention for selectively adjusting the width of phase regions to locally re-balance the phase widths. The program shown in FIG. 8 begins in step 40 which leads to step 42 of identifying the critical segments of the phase shapes in the transistors layouts which are the thin legs VA/VB/VC shown in FIG. 5

In step 44, the system creates basic phase shapes withe phase regions 12A/14A for leg VA, phase regions 14B/12B for leg VB and phase regions 14C/12C for leg VC.

Next in the program proceeds along line 45 to step 46 to remove layout violations, i.e. clean up or legalize the phase shapes. For example in FIG. 5, the narrow phase shapes 14A/14B are too close to satisfy the criterion which states that the remaining thin slivers of the opaque mask may not fall below a minimum width. The result of this step is the merger of the narrow 180° phase shapes 14A/14B in FIG. 5 into the wider 180° phase shape 24 in FIG. 6.

The program then proceeds to step 48 where the test is made as to whether any of the critical segments such as net NET2 have unequal phase widths as is the wider 180° phase shape 24 in FIG. 6 which is more than twice as wide as the two narrow 0° phase shapes 12A/12B in FIG. 6. In that case, the answer is YES and the program proceeds from test 48 along line 49 to step 50 where the action is to widen the narrow phase region(s) to match the width of the wider region(s), which is the result shown in FIG. 7 where the 0° phase shapes 12A/12B in FIG. 6 have been replaced by the wider 0° phase shapes 22A/22B in FIG. 7, thereby resolving the issue.

From step 50, the program proceeds along line 51 to line 45 to repeat step 46 and proceed through step 48, once again.

If the test in step 48 results in a NO answer, the program proceeds to step 54 where the program provides the output to the data processing system performing the CAD operation of which this process is a component and the program ends.

It will be appreciated that the program of FIG. 8 is intended only as an example, and that the invention may be practiced under a variety of conditions and using a variety of layouts and design constraints.

Figure 9:
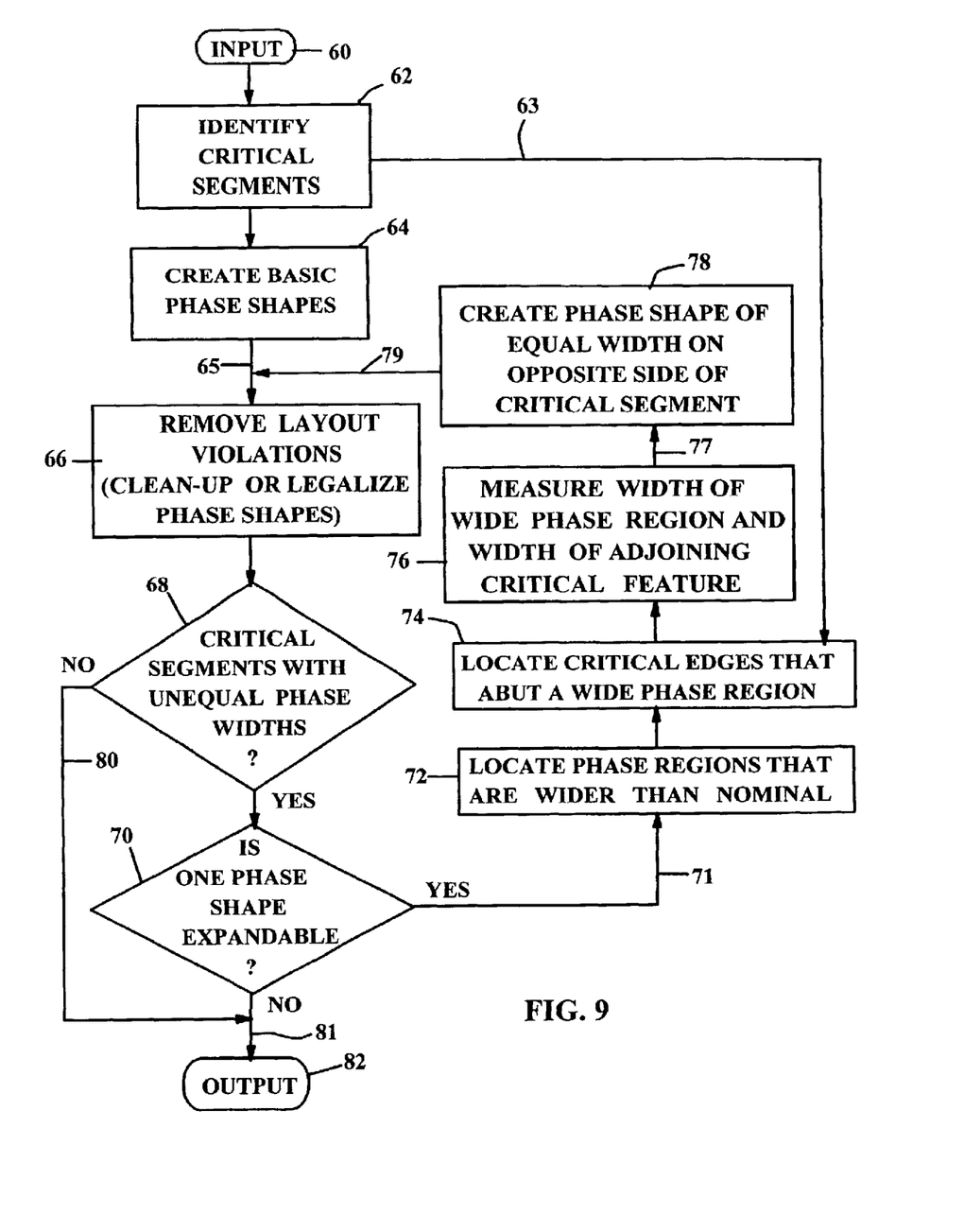
FIG. 9 is a flow chart illustrating a second embodiment of the method of this invention, which is a modification of the method of FIG. 8, for selectively adjusting the width of phase regions to locally re-balance the phase widths.

FIG. 9 shows the flowchart of a second embodiment of the method of this invention which is a modification of the method of FIG. 8. The program shown in FIG. 8 begins with step 60 which leads to step 62 of identifying the critical segments of the phase shapes in the transistors layouts which are the thin legs VA/VB/VC shown in FIG. 5. Step 62 provides an output to step 64 as well as providing an output on line 63 to step 74, which is discussed below.

Next in step 64, the system creates basic phase shapes with the phase regions 12A/14A for leg VA, phase regions 14B/12B for leg VB and phase regions 14C/12C for leg VC.

Next in the program proceeds along line 65 to step 66 to remove layout violations, i.e. clean up or legalize the phase shapes. For example in FIG. 5, the narrow phase shapes 14A/14B are too close to satisfy the criterion which states that the remaining thin slivers of the opaque mask may not fall below a minimum width. The result of this step is the merger of the narrow 180° phase shapes 14A/14B in FIG. 5 into the wider 180° phase shape 24 in FIG. 6.

The program then proceeds to step 68 where the test is made as to whether any of the critical segments such as net NET2 have unequal phase widths as is the wider 180° phase shape 24 in FIG. 6 which is more than twice as wide as the two narrow 0° phase shapes 12A/12B in FIG. 6. If the answer in step 68 is NO, then the program proceeds along line 80 to line 81 to output 82 to provide the output data to the design system and the program ends.

In the case, that the answer to test 68 is YES, then the program proceeds from test 68 to step 70 where the test is made to determine whether one phase is expandable, as are phases 12A/12B in FIG. 6. If the answer to test 70 is NO then the program proceeds along line 81 to output 82 to provide the output data to the design system and the program ends. However, if the answer to test 70 is YES then the program proceeds along line 71 to step 72 where the program determines the locations of phase regions that are wider than nominal widths, as is phase region 24 in FIG. 6.

Next, in step 74 the system determines the locations of critical edges that abut a wide phase region, i.e. the edges of lines VA and VB using the outputs from steps 62 and 72 in performing that determination.

Next in step 76, the system measures the width of the wise phase region(s) such as phase region 24 in FIG. 6 and the width of the adjoining critical feature(s), i.e. lines VA/VB.

Step 76 leads to step 78 where the system creates a phase shape of equal width on the opposite side(s) of the critical segment(s) VA/VB, which is the result shown in FIG. 7 where the 0° phase shapes 12A/12B in FIG. 6 have been replaced by the wider 0° phase shapes 22A/22B in FIG. 7, thereby resolving the issue.

Then the program proceeds along line 79 to line 65, where the system proceeds as described above, recycling through steps 72, 74, 76 and 78 until the program has determined that the result complies with the criteria set by tests 68 and 70.

It will be appreciated that the program of FIG. 9 is intended only as an example and that the invention may be practiced under a variety of conditions and using a variety of layouts and design constraints.

It will also be appreciated by those skilled in the art that the method and software in accordance with the present invention is not limited to dark field altPSM design, but can also apply and be adapted to light field altPSM design. Accordingly, the invention is intended to encompass all such alternatives, modifications and variations which fall within the scope and spirit of the invention and the following claims.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method for designing an alternating phase shifting mask (altPSM), the mask including a substrate, the method comprising:
   a) providing a circuit layout;
   b) identifying a plurality of critical elements of said circuit layout;
   c) providing a cutoff layout dimension;
   d) identifying critical segments of the circuit layout wherein each of the plurality of critical elements has a sub-cutoff dimension less than said cutoff dimension;
   e) creating basic phase shapes associated with the critical segments;
   f) removing layout violations from the phase shapes;
   g) performing a test to determine whether the widths of phase shapes associated with a critical segment have unequal narrower and wider widths and if the test result is YES, then widening each narrower phase shape to match the width of wider phase shape associated with the critical segment and repeating steps (f) through (g) until the test results in a NO answer; and
   h) if the test result is NO, then providing a layout pattern to an output.

2. The method of claim 1 including:
   generating a first phase shape and a second phase shape disposed on opposing sides of each of the sub-cutoff dimensions; and
   coloring phase shapes for each of the sub-cutoff dimensions so that the first phase shape and the second phase shape are assigned opposite phase colors.

3. The method of claim 2 wherein the opposite phase colors are 180° out of phase.

4. The method of claim 2 wherein the opposite phase colors consist of 0° and 180° phase shifts.

5. The method of claim 1 wherein widening involves the following steps:
   i) determining whether one phase shape is expandable;
   j) locating phase regions that are wider than nominal;
   k) locating critical edges that abut a wide phase region;
   l) measuring the width of the wide phase region and the width of an adjoining critical feature; and
   m) creating a phase shape of equal width on the opposite side of a critical segment.

6. The method of claim 5 including:
   generating a first phase shape and a second phase shape disposed on opposing sides of each of the sub-cutoff dimensions; and
   coloring phase shapes for each of the sub-cutoff dimensions so that the first phase shape and the second phase shape are assigned opposite phase colors.

7. The method of claim 6 wherein the opposite phase colors are 180° out of phase.

8. The method of claim 6 wherein the opposite phase colors consist of 0° and 180° phase shifts.

9. A computer program product comprising a computer readable storage medium having stored therein instructions executable by the computer for performing a method for designing an alternating phase shifting mask (altPSM), the mask including a substrate, the method comprising:

a) providing a circuit layout;
b) identifying a plurality of critical elements of said circuit layout;
c) providing a cutoff layout dimension
d) identifying critical segments of the circuit layout wherein each of the plurality of critical elements has a sub-cutoff dimension less than said cutoff dimension;
e) creating basic phase shapes associated with the critical segments;
f) removing layout violations from the phase shapes;
g) performing a test to determine whether the widths of phase shapes associated with a critical segment have unequal narrower and wider widths and if the test result is YES, then widening each narrower phase shape to match the width of wider phase shape associated with the critical segment and repeating steps (f) through (g); and
h) if the test result is NO, then providing a layout pattern to an output.

10. The computer program product of claim 9 including:
generating a first phase shape and a second phase shape disposed on opposing sides of each of the sub-cutoff dimensions; and
coloring phase shapes for each of the sub-cutoff dimensions so that the first phase shape and the second phase shape are assigned opposite phase colors.

11. The computer program product of claim 10 wherein the opposite phase colors are 180° out of phase.

12. The computer program product of claim 10 wherein the opposite phase colors consist of 0° and 180° phase shifts.

13. The computer program product of claim 9 wherein widening involves the following steps:
i) determining whether one phase shape is expandable;
j) locating phase regions that are wider than nominal;
k) locating critical edges that abut a wide phase region;
l) measuring the width of the wide phase region and the width of an adjoining critical feature; and
m) creating a phase shape of equal width on the opposite side of a critical segment.

14. The computer program product of claim 13 including:
generating a first phase shape and a second phase shape disposed on opposing sides of each of the sub-cutoff dimensions; and
coloring phase shapes for each of the sub-cutoff dimensions so that the first phase shape and the second phase shape are assigned opposite phase colors.

15. The computer program product of claim 14 wherein the opposite phase colors are 180° out of phase.

16. The computer program product of claim 15 wherein the opposite phase colors consist of 0° and 180° phase shifts.

17. A computer program product comprising a computer readable storage medium having stored therein instructions executable by the computer for performing a method for assigning a binary property to circuit elements, the method comprising:

a) providing a circuit layout;
b) identifying a plurality of critical elements of said circuit layout;
c) providing a cutoff layout dimension;
d) identifying critical segments of the circuit layout wherein each of the plurality of critical elements has a sub-cutoff dimension less than said cutoff dimension;
e) creating an inverse pair of basic phase shapes associated with the critical segments juxtaposed therewith on opposite sides thereof;
f) removing layout violations from the phase shapes;
g) performing a test to determine whether the widths of phase shapes associated with a critical segment have unequal narrower and wider widths and if the test result is YES, then widening each narrower phase shape to match the width of wider phase shape associated with the critical segment and repeating steps (f) through (g); and
h) if the test result is NO, then providing a layout pattern to an output.

18. The computer program product of claim 17 wherein widening involves the following steps:
i) determining whether one phase shape is expandable;
j) locating phase regions that are wider than nominal;
k) locating critical edges that abut a wide phase region;
l) measuring the width of the wide phase region and the width of an adjoining critical feature; and
m) creating a phase shape of equal width on the opposite side of a critical segment.

19. The computer program product of claim 18 including:
generating a first phase shape and a second phase shape disposed on opposing sides of each of the sub-cutoff dimensions; and
coloring phase shapes for each of the sub-cutoff dimensions so that the first phase shape and the second phase shape are assigned opposite phase colors.

20. The computer program product of claim 19 wherein the opposite phase colors are 180° out of phase.

* * * * *